United States Patent [19]

Supnik

[11] Patent Number: 5,070,502
[45] Date of Patent: Dec. 3, 1991

[54] DEFECT TOLERANT SET ASSOCIATIVE CACHE

[75] Inventor: Robert M. Supnik, Carlisle, Mass.

[73] Assignee: Digital Equipment Corporation, Maynard, Mass.

[21] Appl. No.: 370,469

[22] Filed: Jun. 23, 1989

[51] Int. Cl.$^5$ .............................................. G06F 11/20
[52] U.S. Cl. .................. 371/11.1; 371/10.2; 365/200
[58] Field of Search ............... 371/11.1, 10.2, 21.6, 371/21.3, 21.2, 21.1, 13, 40.1, 40.3, 10.1; 365/200, 201; 364/200 MS File, 900 MS File

[56] References Cited

U.S. PATENT DOCUMENTS

| | | | |
|---|---|---|---|
| 3,222,653 | 12/1965 | Rice | 340/172.5 |
| 3,434,116 | 3/1969 | Anacker | 340/172.5 |
| 3,633,175 | 1/1972 | Harper | 340/172.5 |
| 3,644,899 | 2/1972 | Boisvert | 371/11.1 X |
| 3,665,175 | 5/1972 | Bouricius | 371/11.1 |
| 3,820,078 | 6/1974 | Curley et al. | 340/172.5 |
| 4,061,908 | 12/1977 | de Jonge | 371/21.3 |
| 4,066,880 | 1/1978 | Salley | 371/11.1 |
| 4,255,808 | 3/1981 | Schaber | 371/21.6 X |
| 4,380,066 | 4/1983 | Spencer et al. | 371/10 |
| 4,456,995 | 6/1984 | Ryan | 371/21.6 |
| 4,464,717 | 8/1984 | Keeley et al. | 364/200 |
| 4,575,792 | 3/1986 | Keeley | 371/21.2 X |
| 4,641,310 | 2/1987 | Martens | 371/21.6 |
| 4,686,621 | 8/1987 | Keeley et al. | 364/200 |
| 4,740,971 | 4/1988 | Tam | 371/21.2 X |
| 4,831,622 | 5/1989 | Porter | 371/10.1 |
| 4,886,673 | 11/1989 | Witt | 371/21.1 X |

Primary Examiner—Clark A. Jablon
Assistant Examiner—Robert W. Beausoliel
Attorney, Agent, or Firm—Arnold, White & Durkee

[57] ABSTRACT

It is desirable to bypass the defects within a cache memory so that a high percentage of the cache is usable; otherwise the entire chip containing the cache memory must be scrapped. Since VLSI chips with a small number of defects form a large proportion of the scrapped yield, rendering chips with a small number of defects usable greatly increases the production yield and reduces the cost of each chip. Therefore, a cache memory is provided wherein each memory location includes a bit which is set in response to a detected hardware defect. Preferably, each memory location in the cache is tested by error detecting software, which sets the defect bit in any memory location containing a defect. The defect bit is tested every time data is retrieved from each memory location, and a set defect bit prohibits further use of a defective memory location.

16 Claims, 4 Drawing Sheets

DEFECT TOLERANT SET ASSOCIATIVE CACHE

BACKGROUND OF THE INVENTION

This invention relates generally to cache-based computer systems, and more particularly to a set associative cache which functions effectively in the presence of repeatable defects.

The main memory of a computer system is generally accessed in a logical order and often in a sequential fashion. Typical examples include the processing of array structures and the sequencing of instructions in executing a particular program. Alternatively, a program may repeatedly execute an instruction loop prior to transferring control to a localized area. In both of these cases, a substantial increase in the execution speed of the individual processes, and consequently the overall computer system, can be achieved if a fast auxiliary memory is provided which is capable of retaining sufficient data to avoid repeated references to the slower system memory; caches associated with system memory provide this function.

Cache memories are commonly used in high-performance computer systems in order to optimize the ratio of system memory to processor speed. Typically implemented in the form of small, high-speed buffer memories, caches continually obtain and temporarily retain data that associated system processors are likely to require in executing current operations. This data is usually in the form of a block of memory which includes the most recently used instructions and data items.

The operation of such cache memory schemes is based upon the phenomenon of locality exhibited by programs in the generation of addresses and memory usage. A program with a high degree of locality does not refer to many widely scattered memory locations in a short period of time. Therefore, cache memories essentially provide a "window" into the system memory for associated processors and permit high-speed access to data references with both spatial and temporal locality.

In typical cache implementations, the cache memory resides between a processor and the system memory, which is often referred to as the primary or main memory. Memory addresses are interpreted by using an associative memory map which defines a correspondence between address locations requested by the processor and the cache contents. If a requested data item exists within the cache, requests to main memory are inhibited by the associative memory and the desired data is supplied from the cache to the requesting processor. The system memory is accessed only when a requested data item is not located within the cache. In such a case, the required data is fetched from the system memory and then supplied to the requesting processor. In addition to fetching the requested data, the cache typically fetches several bytes of data in the vicinity of the requested data in anticipation that the processor will attempt to access the next sequential series of bytes.

Cache memories for use with high speed computer systems are fabricated on VLSI chips, and the cache memories are usually fabricated on the microprocessor chips to provide optimum access times. However, as the device density on VLSI chips increases, device defects per unit area increase. Since on-chip cache assumes an increasingly greater proportion of the chip area, defects within the on-chip cache increase. Steps must be taken to bypass the defects so that a high percentage of the cache is usable otherwise the entire chip must be scrapped. Since VLSI chips with a small number of defects form a large proportion of the scrapped yield, rendering chips with a small number of defects usable greatly increases the production yield and reduces the cost of each chip.

One popular technique for bypassing defects within on-chip cache is fabricating memory arrays having redundant rows and/or columns. After manufacture and before a chip can be shipped, each memory on the chip is tested for defects. Any defects are corrected by substituting a defective row or column with a redundant row or column. This substitution is done by destroying fusible links which interconnect the memory elements with a laser or with a PROM-like programming method. However, this technique for correcting defects within a cache has drawbacks. First, more silicon area is required for each cache memory because of the redundant rows and columns, and, secondly, errors must be detected and corrected at the time of manufacture.

Another common technique uses software diagnostic routines which test for proper cache operation. These routines transfer information from the system memory to the cache. The information is then read from the cache and compared with known information. If the comparison does not produce a "hit", i.e., if the compared information is not identical, then the software routine degrades the cache level so that it cannot be accessed.

Other common techniques include interfacing software-controlled testing apparatus to logic which disables an entire memory level if any entry in that level is defective. Techniques of this type can be used to detect errors in controller portions of the cache in addition to errors in the cache memory. The testing apparatus typically responds to certain commands which enable the cache system to signal when the data requested from cache is not stored in cache after the cache has been initialized. If a defect is detected by the apparatus or the central processing unit (CPU), the entire cache, or at least the defective cache memory level, is bypassed. By way of example, a 4-level set associative cache has 4096 words of storage which are organized into 4 rows by 1024 columns. Therefore, using a testing apparatus of this type, an entire level, i.e., one-fourth of the available cache, would be disabled if a single defect is found.

The present invention is directed to overcoming one or more of the problems as set forth above.

SUMMARY OF THE INVENTION

In accordance with one embodiment of the present invention, a method for disabling a defective memory address location in a cache memory is provided in which a bit in each memory address location is reserved for indicating the presence of a defect. Each cache memory address location is tested for a defect, and the reserved bit in a tested memory address location is set in response to a detected defect in the tested memory address location. During subsequent normal use of the cache memory, the use of any memory address location containing a set reserved bit is inhibited.

Specifically, the memory is tested by loading each bit of each memory address location with a binary zero, and comparing the contents of each memory address location with a first preselected number to ensure that each bit of each memory address location contains a binary zero. The reserved bit in a memory location is set if at least one of the bits in the memory address location does not contain a binary zero. In addition, each bit in each memory address location is loaded with a binary one, and the contents of each memory address location are compared with a second preselected number to ensure that each bit of each memory address location contains a binary one. The reserved bit in a memory address location is set if at least one of the bits in the memory address location does not contain a binary one. During subsequent normal use of the computer system, each time a cache memory address location is accessed, the status of the reserved bit is tested to determine its status. If the reserved bit is not set, then the memory address location is available for use; if the reserved bit is set, the memory address location is by-passed.

The above method therefore is advantageous in that individual defective cache entries rather than an entire level of memory is by-passed; the above method uses much less silicon than methods employing wholly redundant columns; and defective cache entries are detected and disabled during each system initialization in a computer system employing cache memories. The result is reduced cost of VLSI chips having memory systems thereon.

BRIEF DESCRIPTION OF THE DRAWINGS

The novel features believed characteristic of the invention are set forth in the appended claims. The invention itself, however, as well as other features and advantages thereof, will be best understood by reference to a detailed description of a specific embodiment which follows, when read in conjunction with the accompanying drawings, wherein:

DETAILED DESCRIPTION OF SPECIFIC EMBODIMENT

Figure 1:
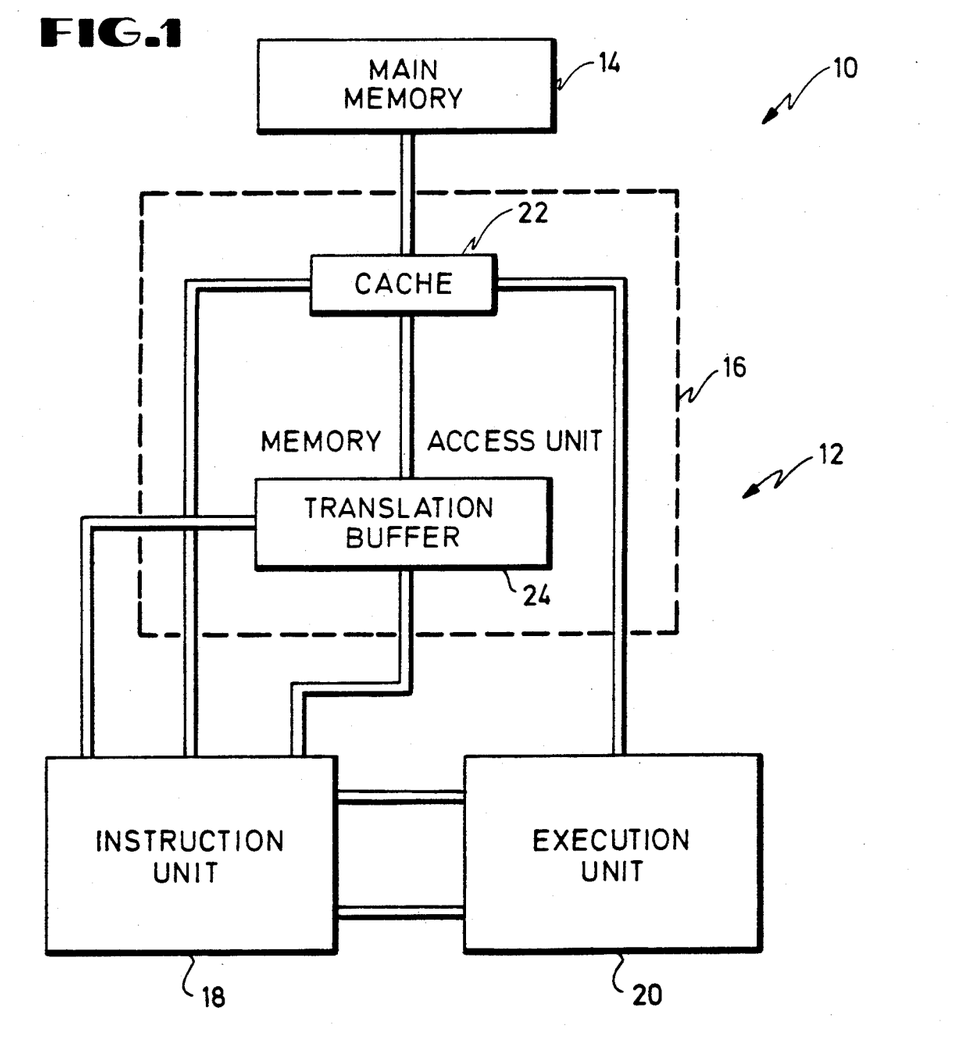
FIG. 1 is an electrical diagram in block form of a pipelined computer system employing a cache memory in accordance with one embodiment of the present invention.

Referring initially to FIG. 1, a top level block diagram of a portion of a computer system 10 is illustrated. The system 10 includes at least one central processing unit (CPU) 12 having access to a main memory 14 which typically comprises a plurality of memory modules. It should be understood that additional CPUs could be used in such a system by sharing the main memory 14. In this case, a system control unit (not shown) would controllably link the various CPUs to the main memory.

Inside the CPU 12, the execution of an individual instruction is broken down into multiple smaller tasks. These tasks are performed by dedicated, separate, independent functional units that are optimized for their specific tasks. Although each instruction ultimately performs a different operation, each instruction is broken into many smaller tasks which are common to all instructions. Generally, the following steps are performed during the execution of an instruction: instruction fetch, instruction decode, operand fetch, execution, and result store. Thus, by the use of dedicated hardware stages, the steps can be overlapped, thereby increasing the total instruction throughput. This processing technique is commonly known as pipelining.

The illustrative system 10 of FIG. 1 is representative of a pipelined virtual memory-based computer system. In accordance with the concept of pipelining, the CPU 12 is a non-homogenous processor which includes a set of special-purpose functional units dedicated to and optimized for performing specific tasks into which individual instructions are split prior to execution. The data path through the pipeline includes a respective set of registers for transferring the results of each pipeline stage to the next pipeline stage. These transfer registers are clocked in response to a common system clock. For example, during a first clock cycle, the first instruction is fetched by hardware dedicated to instruction fetch. During the second clock cycle, the fetched instruction is transferred and decoded by instruction decode hardware, but, at the same time, the next instruction is fetched by the instruction fetch hardware. During the third clock cycle, each instruction is shifted to the next stage of the pipeline and a new instruction is fetched. Thus, after the pipeline is filled, an instruction will be completely executed at the end of each clock cycle.

As shown in FIG. 1, each CPU 12 is partitioned into at least three functional units: the memory access unit 16, the instruction unit 18, and the execution unit 20. The instruction unit 18 fetches instructions, decodes operation codes (op-codes) and specifiers, fetches operands, and updates the system program counter. The execution unit 20 executes the decoded instructions and fetched operands.

The memory access unit 16 includes a main cache 22 which, on an average basis, enables the instruction and execution units 18, 20 to process data at a faster rate than the access time of the main memory 14. In particular, the memory access unit 16 serves as means for accepting memory references, usually virtual, translating the references to physical addresses, and initiating accesses to memory data, either in main memory 14 or more importantly, within the cache 22. This cache 22 includes means for storing selected predefined blocks of data elements, means for receiving requests from the instruction unit 18 via a translation buffer 24 to access a specified data element, means for checking whether the data element is in a block stored in the cache 22, and means operative when data for the block including the specified data element is not so stored for reading the specified block of data from the main memory 14 into the cache 22.

The memory access unit 16 interprets memory addresses by using an associative memory map which defines a correspondence between requested address locations and cache contents. As shown in FIG. 1, the translation buffer 24 is a high speed associative memory which stores the most recently used virtual-to-physical address translations. In a virtual memory system, a reference to a single virtual address can cause several memory references before the desired information is made available. However, where the translation buffer 24 is used, translation is simplified by finding a "hit", i.e., a corresponding address, in the translation buffer 24.

The memory access unit 16 operates by inhibiting requests to main memory and supplying data requested by the processor from the cache 22 if the requested data item is found to exist within the cache 22. In other words, the cache 22 provides a "window" into the main memory 14, and contains data likely to be needed by the instruction and execution units 18,20. The organization and operation of a similar cache and translation buffer are further described in Chapter 11 of Levy and Eckhouse, Jr., *Computer Programming and Architecture, The VAX-11*, Digital Equipment Corporation, pp. 351-368 (1980). Such "VAX" brand digital computers are commercially available from Digital Equipment Corporation, 111 Powdermill Road, Maynard, MA 01754-1418.

If a data element needed by the instruction and execution units 18,20 is not found in the cache 22, then the data element is obtained from the main memory 14. In the process, an entire block, including additional data, is obtained from the main memory 14 and written into the cache 22. Due to the principle of locality in time and memory space, the next time the instruction and execution units desire a data element, there is a high degree of likelihood that this data element will be found in the block which includes the previously addressed data element. Consequently, it is probable that the cache 22 will already include the data element required by the instruction and execution units 18,20. In general, since the cache 22 is accessed at a much higher rate than the main memory 14, the main memory 14 can have a proportionally slower access time than the cache 22 without substantially degrading the average performance of the computer system 10. Therefore, the main memory 14 is constructed of slower and less expensive memory elements.

Conversely, the cache 22 is a high-speed buffer memory which is fabricated on a VLSI silicon chip, and preferably on a microprocessor chip to enhance access time. While many different fabrication techniques may be used to fabricate the onchip cache, there is no fabrication technique which can be used to fabricate a VLSI memory without producing occasional defects. Each on-chip memory includes memory control logic, such as memory address registers and decoders, and, of course memory storage cells. Since the largest portion of an on-chip memory is comprised of rows and columns of densely packed memory storage cells, the majority of defects exist in the memory storage cells.

Figure 2:
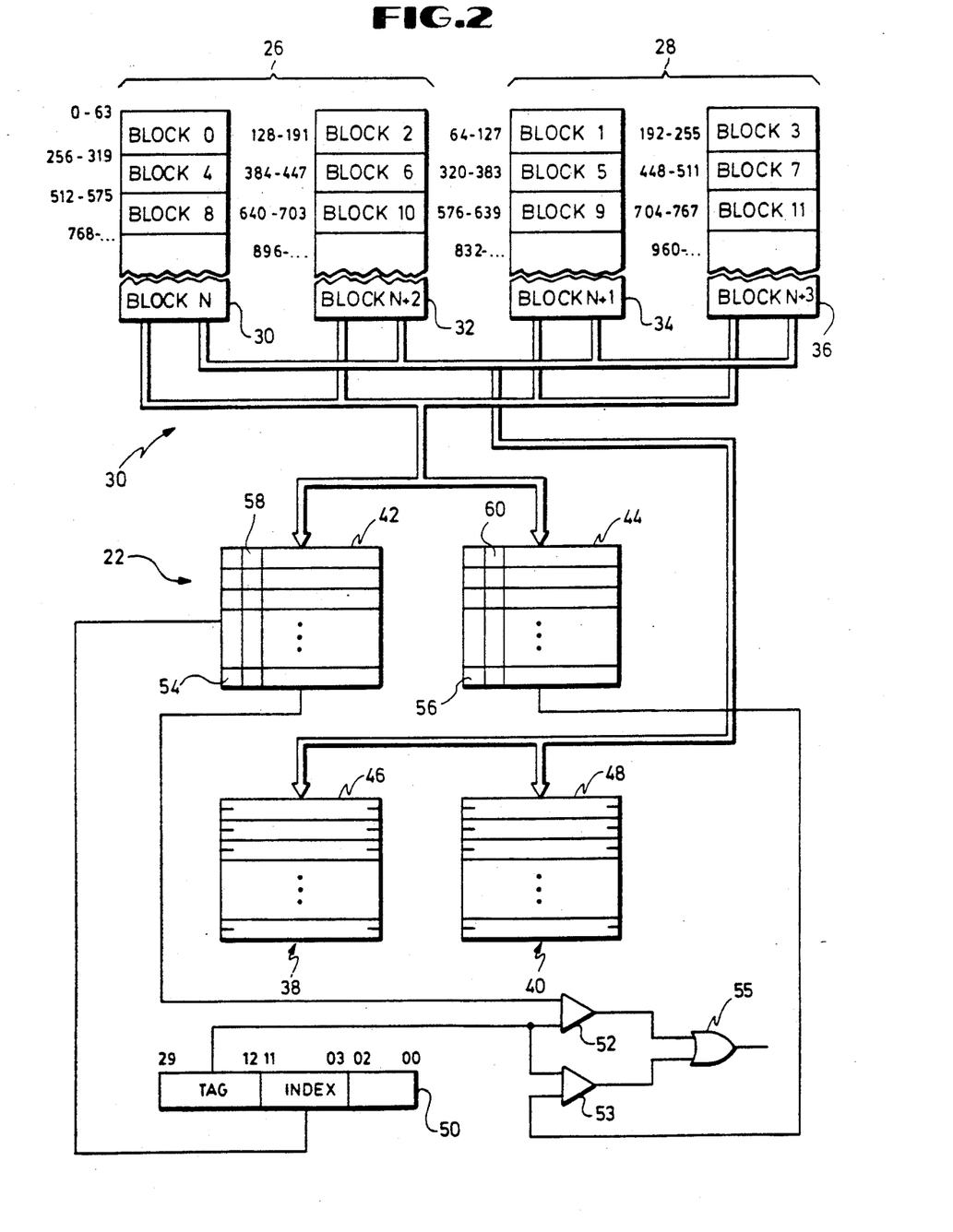
FIG. 2 is an electrical diagram in block form of a cache memory used in the computer system of FIG. 1 in accordance with one embodiment of the present invention.

Referring now to FIG. 2 there is shown a block diagram of the preferred organization of the cache 22 and the storage section of the main memory 14. As shown therein, the data storage section of the main memory 14 comprises a pair of segments 26, 28 each of which comprises a pair of memory banks. The four memory banks are respectively designated as 30, 32, 34 and 36. The memory banks use dynamic random access memory chips (DRAM) and may each store, for example, up to 64 megabytes of data.

The main memory 14 preferably has a sequent-based organization which includes at least one main memory unit formed of four extended hex-size memory modules, each preferably providing 64 megabits (m-bits) of storage using a one megabit DRAM.

To improve memory throughput in a computer system which uses several CPUs or several memory access units, the memory addresses for the memory banks are interleaved on block boundaries. Such interleaving is shown for a preferred data block size of 64 bytes. A first block (BLOCK 0) has byte addresses 0-63 associated with it and is stored in the first bank 30 of the first memory segment 26; the next consecutive block comprising byte addresses 64-127, i.e., the second block (BLOCK 1), is stored in the first bank 34 of the second memory segment 28; the third block (BLOCK 2) having byte addresses 128-191 associated with it is stored in the second bank 32 of the first memory segment 26; the fourth memory block (BLOCK 3) has byte addresses 192-225 associated with it and is stored in the second bank 36 of the second memory segment 28; the fifth bank (BLOCK 4) has byte addresses of 256-319 associated with it and is stored in the first bank 30 of the first memory segment 26, and so on.

Referring again to FIG. 2, there is shown a block diagram of the preferred organization of the cache 22. The cache 22 is a two-way set associative cache. The cache 22 is divided into two parallel sets 38, 40 wherein each set includes an address (tag) storage portion 42, 44 and a data storage portion 46, 48. Each data storage portion 46, 48 is organized for storing selected ones of the predefined blocks of the data elements $D_{1j}, D_{2j}$. In order to indicate whether data for a specified block is stored in one of the data storage portions 46, 48, each address storage portion 42, 44 is organized for storing respective tags $T_{1j}, T_{2j}$ associated with the blocks.

The cache 22 further includes an address register 50 which specifies a block address. As specifically shown in FIG. 2, a "tag" comprises the upper portion of the block address. In response to a fill request from the cache 22, an addressed block in the main memory 14 is transferred to one or more predefined slots in one of the data storage portions 46, 48. The slots associated with a given block are indexed by an index j. The index j and the tag for a particular block specifies the block address for that block. Therefore, when an address of a desired byte is received in the address register 50, the index j points to at least one corresponding slot in one of the address storage portions 42, 44.

Means, such as comparators 52, 53 and an OR gate 55, is provided for checking whether data for a specified block is stored in the cache memory 22. The addressed tag $T_{1j}$ is fed to the comparator 52 for comparison with the tag specified by the byte address. If the comparator 52 detects coincidence, the output of the OR gate delivers a logic "1", and a "hit" is indicated signalling that the desired byte is included in the block in the corresponding data storage portion 46, which is indexed by the index j. Otherwise, the comparator 52 indicates a "miss" and the index j points to at least one corresponding slot in the other of the address storage portion 44. The addressed tag $T_{2j}$ is fed to the comparator 53 for comparison with the tag specified by the byte address. If this comparison detects a "hit", the output of the OR gate delivers a logic "1", and the desired byte is included in the block in the data storage portion 48. If this comparison detects a "miss", however, a corresponding fill request is placed and transmitted to the corresponding one of the four memory banks 30-36 which stores the blocks specified by the block address from the address register 50.

As further illustrated in FIG. 2, each of the address storage portions 42, 44 and each of the data storage portions 46, 48 include 512 different slots which are specified by an index j having nine binary bits. These binary bits are located at bits 3 to 11 of the byte address. Typically each data element includes eight contiguous bytes forming a "quad word." The position of the byte in a quad word is specified by a "byte remainder" including bits 0-2 of the byte address. The bits 0-2 of the byte address specify the particular position of each byte of the 64 bit quad word in the block addressed by the address register 50.

To insure that the data retrieved from the cache 22 is valid, each entry in the tag portions 42, 44 include a single "valid" bit 54, 56. When a processor modifies information within its cache, the revised information needs to be replaced in the main memory so that the cache and the main memory always hold valid copies of stored data. If the valid bit 54, 56 is set, then the data stored in the cache 22 is valid, and, therefore, will be retrieved. However, if the valid bit is not set, then the data stored in the particular cache location is invalid, so the main memory must be accessed to obtain valid data.

Data errors may also be caused by hardware faults, such as defective memory storage cells. As mentioned previously, the densely packed storage cells of high speed cache memories are susceptible to hardware defects. In order to use cache memories which contain a few defects, an additional single bit entry called a "defect" bit 58, 60 is incorporated into each entry in the tag storage portions 42, 44 of the cache 22. If the defect bit 58, 60 for a particular entry is set, then that entry contains a defect and will no longer be used to retrieve or transfer data. During comparison, the defective entry will neither produce a "hit" nor is the entry eligible for use on future cache fills. Alternatively, if the defect bit 58, 60 for a particular entry is clear, then the entry participates normally in cache operations.

The state of the defect bit 58, 60 is controlled by initialization software or error handling software. If an entry is found to be invalid during initialization, or if an entry produces a hard entry during operation, the defect bit for that particular entry is set. Once set the defect bit essentially removes the entry from the cache. Because the cache 22 is set associative, removing an entry does not make memory addresses which map to that entry non-cacheable. Instead, removing an entry reduces the associativity of caching those entries by one. Therefore, in the case of the two-way set associative cache 22 described in detail herein, a defective entry leaves only one possible location for data instead of two for a fully functional twoway set associative cache.

Figure 3A:
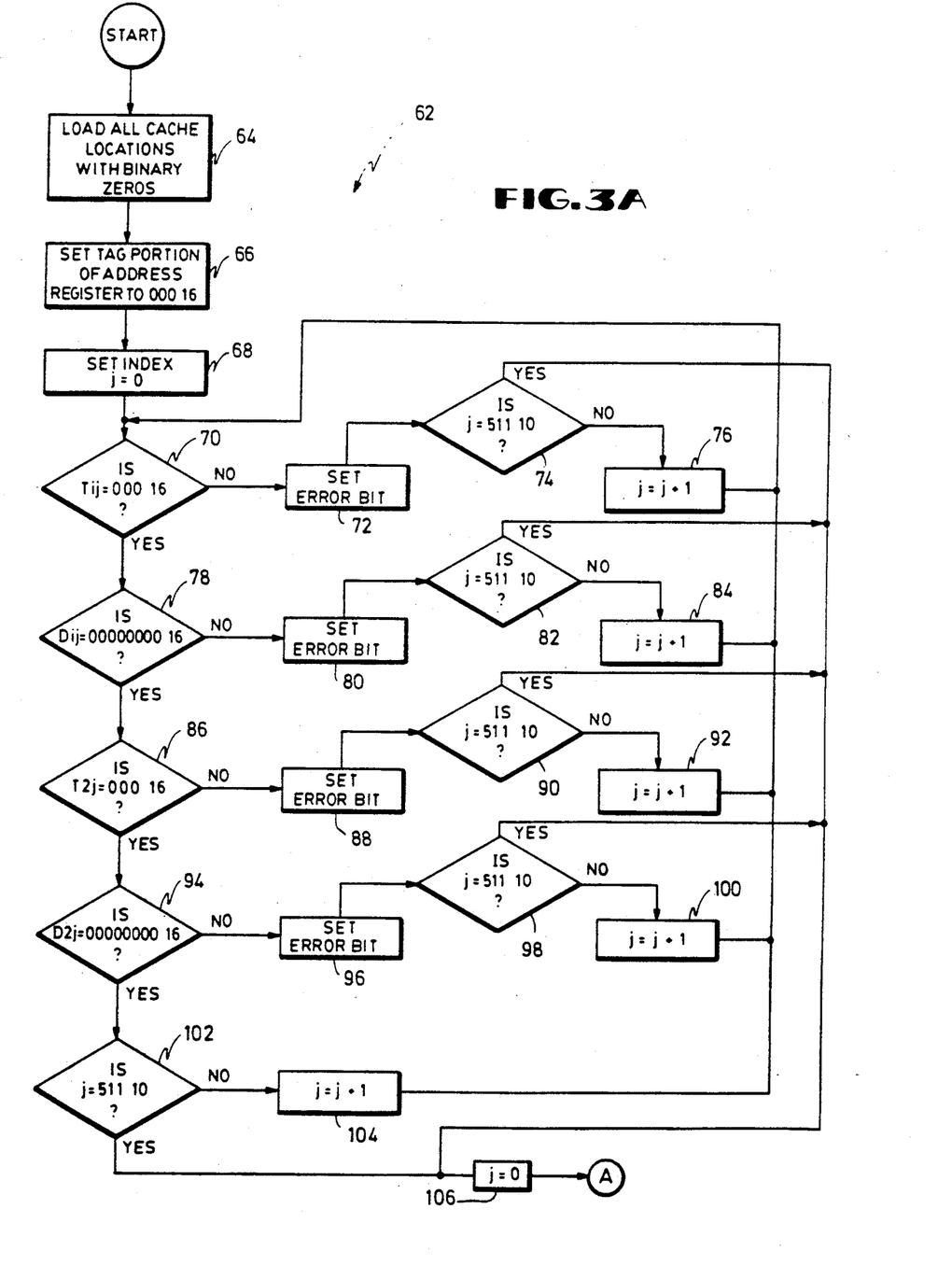
FIGS. 3A and 3B show a flowchart describing an error checking routine in accordance with one embodiment of the present invention.
Figure 3B:
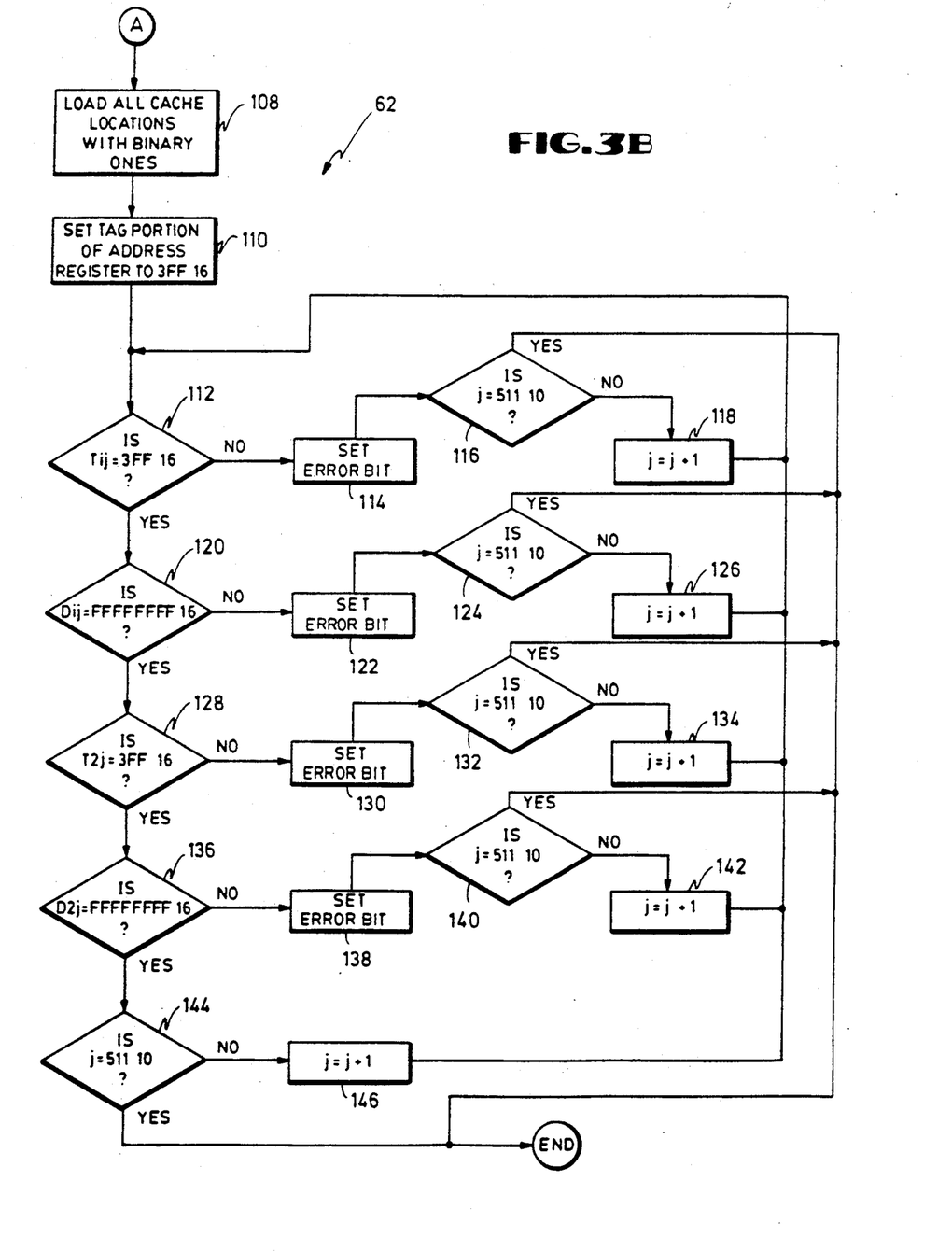

A flowchart 62 of an appropriate error detecting program is illustrated in FIG. 3. Briefly, the error detecting program first loads all of the memory locations in the cache 22 with binary zeros, and checks all of the memory locations to ensure that they contain nothing except binary zeros. Next, the error detecting program loads all of the memory locations in the cache 22 with binary ones, and checks all of the memory locations to ensure that they contain nothing except binary ones. If any bit in any of the memory locations cannot become a binary zero and a binary one, then the error bit in that memory location is set so that that memory location is disabled.

Referring now to the flowchart 62, in step 64 all of the memory locations in the address storage portions 42, 44 and the data storage portions 46, 48 of the cache 22 are loaded with binary zeros. Since the tags $T_{1j}$, $T_{2j}$ in the address storage portions 42, 44 contain nine bits, they contain the hexadecimal number $000_{16}$, and since the data storage portions 46, 48 contain quad words $D_{1j}$, $D_{2j}$, they contain the hexadecimal number $00000000_{16}$. In step 66, the "tag" portion of the address register 50 is loaded with binary zeros, so that the comparator 52 compares the "tag" from the address register 50 with the "tag" from the address storage portions 42, 44 to detect hardware errors. Therefore, only the output of the comparator 52 is checked to determine if the memory locations contain the proper data. Using the comparators 52, 53 and the OR gate 55 instead of a software comparison generally speeds up the error detecting routine, but it is understood that a software comparison would work also.

In step 68, the index portion j of the address register 50 is initially set to 0, and subsequently incremented in later steps to sequentially access each memory location.

As shown in step 70, the contents $T_{1j}$ of the first address portion 42 are compared, via the comparator 52, with the contents, $000_{16}$, of the tag portion of the address register 50. If the contents are identical, the contents of the memory location j of the data storage portion 46 are tested in step 78. However, if the contents do not match, there is a hardware error in the memory location designated by the index j (the first memory location of the first address portion 42, in this case). Therefore, step 72 commences and the error bit in memory location j is set to prevent further use of the memory location j. Since an error has been found in memory location j, it is unnecessary to test the remainder of the memory location, i.e., the data portion 46. Accordingly, the index j is checked in step 74 to determine if all of the memory locations 0-511 have been checked yet. If not, the index j is incremented by one in step 76, and the next memory location is checked in step 70.

As shown in step 78, the contents $D_{1j}$ of the first data portion 46 are compared with the hexadecimal number $00000000_{16}$ stored in the error detecting program. If the contents are identical, the contents of the memory location j of the address portion 44 are tested in step 86. However, if the contents do not match, there is a hardware error in the memory location designated by the index j (the first memory location of the first data storage portion 46, in this case). Therefore, step 80 commences and the error bit in memory location j is set to prevent further use of the memory location j. The index j is checked in step 82 to determine if all of the memory locations 0-511 have been checked yet. If not, the index j is incremented by one in step 84, and the next memory location is checked in step 70.

As shown in step 86, the contents $T_{2j}$ of the second address portion 44 are compared, via the comparator 53, with the contents, $000_{16}$, of the tag portion of the address register 50. If the contents are identical, the contents of the memory location j of the data storage portion 48 are tested in step 94. However, if the contents do not match, there is a hardware error in the memory location designated by the index j (the first memory location of the second address portion 44, in this case). Therefore, step 88 commences and the error bit in memory location j is set to prevent further use of the memory location j. Since an error has been found in memory location j, it is unnecessary to test the remainder of the memory location, i.e., the data portion 48. Accordingly, the index j is checked in step 90 to determine if all the memory locations 0-511 have been checked yet. If not, the index j is incremented by one in step 92, and the next memory location is checked in step 70.

As shown in step 94, the contents $D_{2j}$ of the second data portion 48 are compared with the hexadecimal number $00000000_{16}$ stored in the error detecting program. If the contents do not match, there is a hardware error in the memory location designated by the index j (the first memory location of the second data storage portion 48, in this case). Therefore, step 96 commences and the error bit in memory location j is set to prevent further use of the memory location j. The index j is checked in step 98 to determine if all of the memory locations 0-511 have been checked yet. If not, the index j is incremented by one in step 100, and the next memory location is checked in step 70.

If the contents are identical, then the contents of the first memory location j=0 have all been tested, and all of the bits in the first memory location of the address storage portions 42, 44 and the data storage portions 46, 48 are able to produce a binary zero. Therefore, the index j is tested in step 102 to determine if all of the memory locations have been tested for their ability to produce a binary zero. If not, the index j is incremented by one in step 104 so that the next memory location (in this case, the second memory location j=1) may be tested in the previously described manner.

Once all of the memory locations have been tested with binary zeros, the memory locations are tested to determine if all of the bits can produce binary ones. Therefore, the index j is reset to zero in step 106, and step 108 loads all of the memory locations in the address storage portions 42, 44 and the data storage portions 46, 48 of the cache 22 are loaded with binary ones. Since the tags $T_{1j}, T_{2j}$ in the address storage portions 42, 44 contain nine bits, they contain the hexadecimal number $3FF_{16}$, and since the data storage portions 46, 48 contain quad words $D_{1j}, D_{2j}$, they contain the hexadecimal number $FFFFFFFF_{16}$. In step 110, the "tag" portion of the address register 50 is loaded with binary zeros, so that the comparator 52 compares the "tag" from the address register 50 with the "tag" from the address storage portions 42, 44 to detect hardware errors.

As shown in step 112, the contents $T_{1j}$ of the first address portion 42 are compared, via the comparator 52, with the contents, $3FF_{16}$, of the tag portion of the address register 50. If the contents are identical, the contents of the memory location j of the data portion 46 are tested in step 120. However, if the contents do not match, there is a hardware error in the memory location designated by the index j (the first memory location of the first address portion 42, in this case). Therefore, step 114 commences and the error bit in memory location j is set to prevent further use of the memory location j. Since an error has been found in memory location j, it is unnecessary to test the remainder of the memory location, i.e., the data portion 46. Accordingly, the index j is checked in step 116 to determine if all of the memory locations 0-511 have been checked yet. If not, the index j is incremented by one in step 118, and the next memory location is checked in step 112.

As shown in step 120, the contents $D_{1j}$ of the first data storage portion 46 are compared with the hexadecimal number $FFFFFFFF_{16}$ stored in the error detecting program. If the contents are identical, the contents of the memory location j of the address portion 44 are tested in step 128. However, if the contents do not match, there is a hardware error in the memory location designated by the index j (the first memory location of the first data portion 46, in this case). Therefore, step 122 commences and the error bit in memory location j is set to prevent further use of the memory location j. The index j is checked in step 124 to determine if all of the memory locations 0-511 have been checked yet. If not, the index j is incremented by one in step 126, and the next memory location is checked in step 112.

As shown in step 128, the contents $T_{2j}$ of the second address portion 44 are compared, via the comparator 53, with the contents, $3FF_{16}$, of the tag portion of the address register 50. If the contents are identical, the contents of the memory location j of the data storage portion 48 are tested in step 136. However, if the contents do not match, there is a hardware error in the memory location designated by the index j (the first memory location of the second address portion 44, in this case). Therefore, step 130 commences and the error bit in memory location j is set to prevent further use of the memory location j. Since an error has been found in memory location j, it is unnecessary to test the remainder of the memory location, i.e., the data storage portion 48. Accordingly, the index j is checked in step 132 to determine if all of the memory locations 0-511 have been checked yet. If not, the index j is incremented by one in step 134, and the next memory location is checked in step 112.

As shown in step 136, the contents $D_{2j}$ of the second data portion 48 are compared with the hexadecimal number $FFFFFFFF_{16}$ stored in the error detecting program. If the contents do not match, there is a hardware error in the memory location designated by the index j (the first memory location of the second data storage portion 48, in this case). Therefore, step 138 commences and the error bit in memory location j is set to prevent further use of the memory location j. The index j is checked in step 140 to determine if all of the memory locations 0-511 have been checked yet. If not, the index j is incremented by one in step 142, and the next memory location is checked in step 112.

If the contents are identical, then the contents of the first memory location j=0 have all been tested, and all of the bits in the first memory location of the address storage portions 42, 44 and the data storage portions 46, 48 are able to produce a binary one. Therefore, the index j is tested in step 144 to determine if all of the memory locations have been tested for their ability to produce a binary one. If not, the index j is incremented by one in step 146 so that the next memory location (in this case, the second memory location j=1) may be tested in the previously described manner. Once all of the memory locations have been checked to determine if all of the bits in the respective memory locations are able to produce binary ones and binary zeros, the error detecting program ends.

During subsequent operations, if the defect bit is clear, the memory location participates normally in cache operations. If the defect bit is set, the memory location neither produces a "hit" during a cache lookup, nor is it eligible for use during a cache fill.

While the invention is susceptible to various modifications and alternative forms, specific embodiments thereof have been shown by way of example in the drawings and described in detail herein. It should be understood, however, that there is no intent to limit the invention to the particular forms disclosed, but on the contrary, the intention is to cover all modifications, equivalents, and alternatives falling within the spirit and scope of all invention as defined by the appended claims.

What is claimed is:

1. A method for disabling a defective memory address location in a cache memory, comprising the steps of:

a) reserving a bit in each cache memory address location;

b) testing each cache memory address location for a defect;

c) setting said reserved bit in a tested cache memory address location in response to a detected defect in said tested memory address location; and
d) inhibiting use of any cache memory address location containing a set reserved bit.

2. A method according to claim 1 wherein said step of testing includes:
   a) loading each bit of each cache memory address location with a binary zero; and
   b) comparing the contents of each cache memory address location with a preselected number to ensure that each bit of each memory address location contains a binary zero.

3. A method according to claim 2 wherein said reserved bit in a cache memory address location is set if at least one of said bits in said memory address location does not contain a binary zero.

4. A method according to claim 1 wherein said step of testing includes:
   a) loading each bit of each memory address location with a binary one; and
   b) comparing the contents of each memory address location with a preselected number to ensure that each bit of each memory address location contains a binary one.

5. A method according to claim 4 wherein said reserved bit in a memory address location is set if at least one of said bits in said memory address location does not contain a binary one.

6. A method according to claim 1 wherein said step of inhibiting includes:
   a) testing the status of said reserved bit in an accessed memory address location; and
   b) using said memory address location if said reserved bit is not set, and bypassing said memory address location if said reserved bit is set.

7. A method of detecting hardware defects in a set-associative cache memory location and disabling defective cache memory locations from further use, comprising:
   a) reserving a bit in each cache memory location;
   b) testing each cache memory location for a defect;
   c) setting said reserved bit in a tested cache memory location in response to a detected defect in said tested cache memory location;
   d) inhibiting use of any cache memory location containing a set reserved bit;
   e) testing the status of said reserved bit in an accessed cache memory location; and
   f) using said cache memory location if said reserved bit is not set, and bypassing said cache memory location if said reserved bit is set.

8. A method according to claim 7 wherein said step of testing includes:
   a) loading each bit of each cache memory location with a binary zero; and
   b) comparing the contents of each cache memory location with a preselected number to ensure that each bit of each cache memory location contains a binary zero.

9. A method according to claim 8 wherein said reserved bit in a cache memory location is set if at least one of said bits in said cache memory location does not contain a binary zero.

10. A method according to claim 7 wherein said step of testing includes:
    a) loading each bit of each cache memory location with a binary one; and
    b) comparing the contents of each cache memory location with a preselected number to ensure that each bit of each cache memory location contains a binary one.

11. A method according to claim 10 wherein said reserved bit in a cache memory location is set if at least one of said bits in said cache memory location does not contain a binary one.

12. A method of detecting hardware defects in a cache memory location and disabling defective cache memory locations from further use, comprising:
    a) reserving a bit in each cache memory location;
    b) loading each bit of each cache memory location with a binary zero;
    c) comparing the contents of each cache memory location with a first preselected number to ensure that each bit of each cache memory location contains a binary zero;
    d) setting said reserved bit in a cache memory location if at least one of said bits in said cache memory location does not contain a binary zero;
    e) loading each bit of each cache memory location with a binary one;
    f) comparing the contents of each cache memory location with a second preselected number to ensure that each bit of each cache memory location contains a binary one;
    g) setting said reserved bit in a cache memory location if at least one of said bits in said cache memory location does not contain a binary one; and
    h) inhibiting use of any cache memory location containing a set reserved bit.

13. A method according to claim 12 wherein said step of inhibiting includes:
    a) testing the status of said reserved bit in an accessed cache memory location; and
    b) using said cache memory location if said reserved bit is not set, and bypassing said cache memory location if said reserved bit is set.

14. Apparatus for disabling a defective memory address location in a cache memory, comprising:
    a) a cache memory having a plurality of cache memory address locations, and means for reserving a bit in each cache memory address location;
    b) means for testing each cache memory address location for a defect;
    c) means for setting said reserved bit in a tested cache memory address location in response to a detected defect in said tested memory address location; and
    d) means for inhibiting use of any cache memory address location containing a set reserved bit.

15. Apparatus according to claim 14 wherein said means for testing includes:
    a) means for loading each bit of each cache memory address location with a binary zero; and
    b) means for comparing the contents of each cache memory address location with a preselected number to ensure that each bit of each memory address location contains a binary zero.

16. Apparatus according to claim 15 wherein said reserved bit in a cache memory address location is set if at least one of said bits in said memory address location does not contain a binary zero.

* * * * *